United States Patent [19]

Berger et al.

[11] Patent Number: 5,279,925
[45] Date of Patent: Jan. 18, 1994

[54] PROJECTION ELECTRON LITHOGRAPHIC PROCEDURE

[75] Inventors: Steven D. Berger, Basking Ridge; James A. Liddle, Scotch Plains, both of N.J.

[73] Assignee: AT&T Bell Laboratories, Murray Hill, N.J.

[21] Appl. No.: 991,832

[22] Filed: Dec. 16, 1992

[51] Int. Cl.⁵ .............................. G03F 9/00
[52] U.S. Cl. ........................ 430/246; 430/5; 430/269; 430/270; 430/320; 430/311; 430/395; 430/494; 430/966
[58] Field of Search ............ 430/5, 269, 270, 296, 430/307, 311, 320, 396, 494, 966, 967

[56] References Cited

U.S. PATENT DOCUMENTS

| | | | |
|---|---|---|---|
| 5,079,112 | 1/1992 | Berger et al. | 430/296 |
| 5,217,831 | 1/1993 | White | 430/296 |
| 5,299,255 | 7/1993 | White | 430/296 |

Primary Examiner—Jack P. Brammer
Attorney, Agent, or Firm—Bruce S. Schneider

[57] ABSTRACT

It has been found that for a SCALPEL lithographic system thermal effects dictate that the acceleration voltage for the exposing electrons be maintained within a specific range. This range depends on a variety of factors but is generally in the 50 to 150 KeV region. Additionally, thermal considerations also dictate the method of scanning the mask to print an entire wafer.

9 Claims, 2 Drawing Sheets

PROJECTION ELECTRON LITHOGRAPHIC PROCEDURE

BACKGROUND OF THE INVENTION

1. Field of the Invention

This invention relates to lithographic processes and in particular lithographic processes employing charged particle exposure.

2. Art Background

In device processing, an energy sensitive material, denominated a resist, is coated on a substrate such as a semiconductor wafer (e.g., a silicon wafer), a ferroelectric wafer, an insulating wafer, (e.g. a sapphire wafer), a chromium layer supported by a substrate, or a substrate having a combination of such materials. The resist is exposed by subjecting the resist to radiation in the desired image. This image is then developed to produce a patterned resist generally by immersing the resist in a suitable solvent or subjecting it to a plasma to remove selectively either the exposed or unexposed regions. The developed pattern is employed as a mask to process, e.g., etch, the underlying layer. The resist is then removed, for many devices subsequent layers are formed and the resist process is repeated to form overlying patterns in the device. In such repetition of the resist process, the pattern in the resist being processed is typically aligned (registered) relative to underlying patterns typically by using fiducial marks.

Various approaches have been proposed for the exposure of resist with charged particle beams, e.g., electron or ion beams, in the manufacture of submicron devices. (submicron devices in the context of this invention is a body having a pattern with either lines or spaces smaller than 1 $\mu$m.) Electron beam exposure has been extensively used for the making of lithographic masks where the resist overlies a chromium layer that in turn overlies a quartz substrate. The image is produced by raster scanning an electron beam over the resist material in a single cycle and shuttering the beam at appropriate positions to produce the desired exposure image. This single cycle, raster process is capable of producing extremely fine features, but is generally too slow for making devices other than masks.

Alternative approaches have been proposed for exposing devices other than masks in suitable times. (Generally lithographic processing at least 30–60 wafers per hour is considered desirable where a wafer is a substrate typically from two to ten inches in diameter that is ultimately subdivided after fabrication into a plurality of devices.) These exposure approaches are generally divided into proximity and projection procedures. In the former, a mask defining the image by absorptive/reflective regions and transmissive regions for the exposing energy is placed in close proximity to the resist. An electron beam is scanned over the mask or light is flooded onto the mask to expose the underlying resist in regions corresponding to transmissive areas of the mask.

In a projection approach, a lens is interposed between the mask and the resist. The mask is either the absorptive/transmissive type previously described or, alternatively, of a type that scatters in one set of regions and transmits in a second to produce the desired image. The fluence traversing the mask is focused by the lens onto the resist to produce an image corresponding to the mask pattern.

In one specific approach to projection lithography (described in U.S. Pat. No. 5,079,112 dated Jan. 7, 1992, which is hereby incorporated by reference) a mask is employed which scatters and/or reflects electrons in a first set of regions and scatters to a lesser extent, e.g., transmits in a second set of regions. The electrons traversing the mask are caused to converge as shown in FIG. 1 at one or more convergence points by an electron optic projection lens, 5, and an area that transmits to a greater extent than other areas in the plane, e.g., an aperture, is positioned at such convergence point. Scattered electrons, 1b and 1c, do not converge at this point and are essentially blocked while unscattered electrons do converge at the aperture and emerge to expose the resist.

Typically, in an electron exposure proximity printing procedure the electron beam is scanned electronically, i.e., by use of magnetic and electric fields over the mask. In one study published in *Proc. 8th Symp. on Electron and Ion Beam Science and Technology*, 406–419 (1978), it is suggested that a very rapid line scan, i.e., faster than 0.2 ms, with repeated exposure of each portion of the resist to effect the desired dosage is useful to avoid localized heating, and thus localized expansion of the mask. In contrast, expansion of the entire substrate due to uniform heating is electronically compensated for during exposure. (See W. M. Moreau, *Semiconductor Lithography*, Plenum Press, New York, page 435 (1988).) Localized deformations produce errors (called overlay errors) in the placement, i.e., registration, of a resist pattern relative to an underlying pattern. Instead of scanning at a sufficiently slow rate to expose fully each region during one scan cycle, the rate of scanning is substantially increased and exposure is accomplished through a plurality of rapid scan cycles. Despite such precautions, higher acceleration potentials, although yielding enhanced resolution, nevertheless lead to rapidly increasing overlay errors.

For projection light lithography other schemes such as a step and scan procedure have been proposed. In this procedure, a portion of the mask is illuminated over a strip. The image of the entire mask is then projected on the resist by moving the mask and the wafer in opposite directions at a relative rate of speed that depends on the demagnification of the system. For example, if the system has a 4:1 demagnification (meaning a unit length of the mask is projected onto a corresponding one quarter unit length on the substrate) the mask is moved at a rate four times faster than the substrate.

SUMMARY OF THE INVENTION

It has been found that previously unappreciated thermal effects strongly influence the process conditions employed to project an image onto a resist using a SCALPEL system. Surprisingly, in contrast to techniques employing absorptive masks where the localized heating gradients and associated overlay error occur predominantly in the mask and increase concomitantly with increasing acceleration voltage, for SCALPEL there is a minimum in the thermal contribution to the overlay error as the electron acceleration voltage increases. Thus, contrary to previous generic teachings, there exists in a SCALPEL exposure system a preferred range of acceleration voltages that yields a relatively low thermal error and acceptable resolution. Generally, this range of acceleration voltages limits the thermal contribution to the overlay error (hereafter called thermal error) to less than 20%, preferably 10%, most preferably 5% of the design rule. To obtain such limited thermal error, $\Delta x_{tot}$, the magnification, dwell time, and mask membrane thickness used should be that which yields an acceleration voltage, and thermal error, within the acceptable range as determined from the equation:

$$[\Delta x_{tot}]^2 = [\Delta x_{wafer}]^2 + [\Delta x_{mask}]^2 \quad (1)$$

such that $$\Delta x_{wafer} = \delta_1 \cdot \delta_2 \cdot \frac{s}{M} \cdot \alpha \cdot \Delta T_{inst} \quad (2)$$

where M is the demagnification factor, $\alpha$ is the coefficient of expansion of the wafer, e.g., silicon, $\delta_1$ (a factor determined by the elastic constraint for the geometry, i.e., a thin heated region on a thick substrate), and where the value, 0.33, applicable to a thin heated region of circular cross-section (see for example C. J. Tranter, *Quart. Appl. Math.*, 4,298 (1947)), is sufficient in the context of this invention. Additionally, $\delta_2$ is a geometrical factor equal to 0.5; s is a subfield dimension measured at the mask which for a square, a rectangular (of aspect ratio less than 2), circular or hexagonal field (the region illuminated during the dwell time) is the longest dimension, which for a triangular field, is the longest vertex, and which for a rectangular field of aspect ratio greater than 2 is $\sqrt{5} \times$ length of the short side; $\Delta T_{inst}$ is to an acceptable approximation given by $$\Delta T_{inst} = \frac{P \cdot \Delta t}{C \cdot V} \quad (3)$$

where $\Delta t$ is the beam dwell time per flash exposure, C is the heat capacity of the wafer (for example silicon) per unit volume, and V is the volume given by:

$$V = \frac{d_h \cdot a}{M^2} \quad (4)$$

such that a is the area of the sub-field, and $d_h$ is the heated depth which is calculated as the quadrature sum of the electron range and the heat diffusion distance. (The electron range can be calculated using the well known formulae discussed in compendia such as L. Reimer, *Transmission Electron Microscopy*, "Multiple-Scattering Effects", 2nd Edition, Springer-Verlag, page 185 (1989), and the heat diffusion distance, $z_{th}$, is calculated using the formula:

$$z_{th} = \sqrt{\kappa \Delta t} \quad (5)$$

where $\kappa$ is the thermal diffusivity in the substrate—the value for silicon suitably approximated by $10^{-4}$ m$^2$ s$^{-1}$—and P is the power incident on the wafer. The calculation of power is performed for the average thermal case, i.e., the case where 50% of the mask area is covered by pattern, so that $$P = \frac{IE}{2} \quad (6)$$

where I is the beam current incident on the wafer after passing through a mask segment containing no pattern, and E is the accelerating potential last experienced by the electrons entering the wafer. The current can be measured using a Faraday cup.

The thermal error in the mask is $\Delta x_{mask}$, and is represented by $$\Delta x_{mask} = \alpha_s \cdot \delta_2 \cdot \left(\frac{s}{M}\right) \Delta T_{im} \quad (7)$$

where $\alpha_s$ is the coefficient of expansion of the scatterer material of the mask. The instantaneous temperature rise in the mask, $\Delta T_{im}$, is given by:

$$\Delta T_{im} = \left(\frac{P}{T}\right) \cdot \left(\frac{\Delta E}{E}\right) \cdot \left(\frac{\Delta t}{C_s V_s}\right) + \Delta T_{sm} \quad (8)$$

where $C_s$ and $V_s$ are the heat capacity and volume of the scattering material of the mask being heated; ($\Delta E/E$) is the fractional energy lost by an electron in the mask and can be calculated using the Bethe Formula (see for example L. Reimer, *Transmission Electron Microscopy*, "Multiple Scattering Effects", 2nd Edition, Springer-Verlag, page 179 (1989)); T is the fraction of the electron-beam incident on the mask membrane which is passed by the SCALPEL aperture. (T can be determined by measuring the electron-beam current incident on the wafer after passing through an unpatterned mask membrane and dividing this by the current incident on the mask. The currents can be measured using Faraday cups.)

Finally, the steady state temperature rise in the mask, $\Delta T_{sm}$, is suitably approximated by:

$$\Delta T_{sm} = \left(\frac{P}{A}\right) \cdot a \cdot \left(\frac{1}{A' \cdot C_c}\right) \quad (9)$$

where A is the maximum area scanned by the electron-beam at the mask, A' is the area of the mask in contact with a heat sink (e.g., the struts), if present, and $C_c$ is the thermal conductance from the pattern region to the heat sink, (e.g., the struts).

The invention in one embodiment involves employing a magnification, dwell time, and mask membrane thickness which would, according to equations (1) to (9), allowing an acceleration voltage, and thus thermal error, in the specified range. Dwell time is a parameter that should be considered in the context of the scanning procedure. To avoid excessive error due to thermal expansion of the mask and, even more significantly, the substrate, while ensuring complete exposure of a wafer, a combination of 1) beam scanning and 2) movement of the mask relative to the substrate is advantageously employed. A small region (e.g., 1 mm$^2$ at the mask) is illuminated by the beam spot. The beam is scanned over a somewhat larger area of the mask, typically through a 1 cm square. The scan is performed so that illumination for each spot is maintained for an illumination time, i.e., dwell time, typically for many applications in the range 0.1 $\mu$s to 10 $\mu$s with a rapid transition between illuminated regions. Appropriate dwell times, as described by equations (1) to (9), yield advantageously low thermal error. The entire wafer is exposed by moving the mask relative to the substrate.

Similarly, as discussed above, the membrane thickness of the mask should be approximately chosen. Additionally, with such choice, nonuniformities in the mask or from mask to mask upon heating are susceptible to correction.

DETAILED DESCRIPTION

Figure 3:
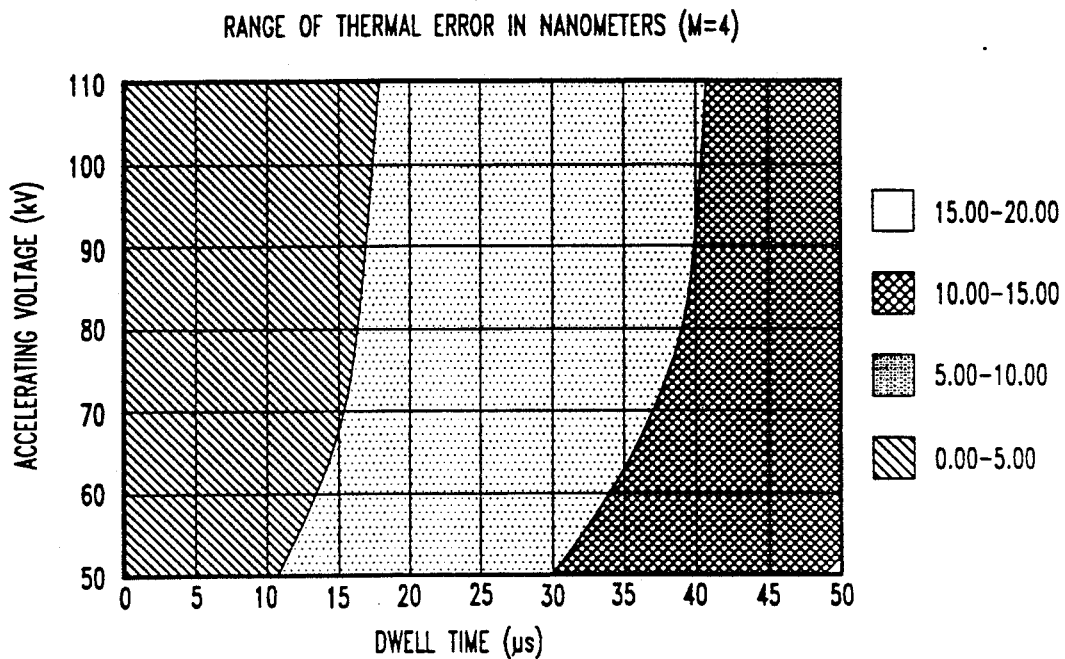
FIGS. 3 and 4 are illustrative of results involved in the invention.
Figure 4:
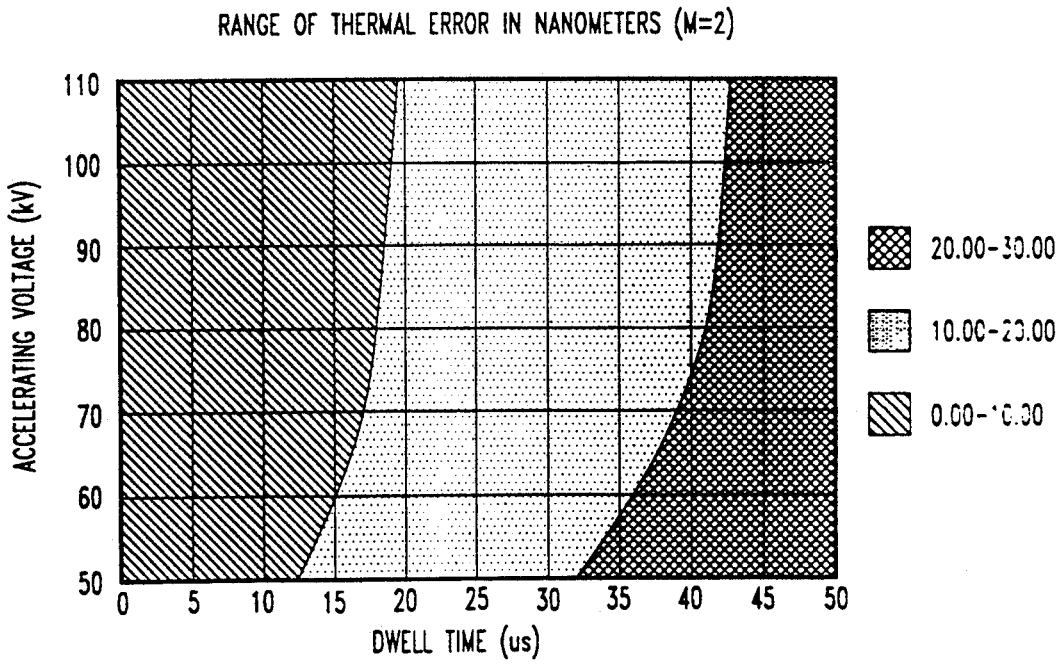

Thermal effects in a SCALPEL system if not appropriately controlled, strongly influence the obtainable pattern resolution. Surprisingly, the effect of thermal expansion and resulting pattern distortion decreases on the substrate with increasing acceleration voltage to offset in a meaningful acceleration regime the inverse effect in the mask. As a result, a minimum in the thermal error with acceleration voltage occurs and by an appropriate choice of 1) membrane thickness, 2) dwell time, and 3) magnification, a thermal error of less than 20% of the design rule is obtainable. The choice of dwell time, magnification, and mask membrane thickness is made as previously discussed by employing equations (1) to (9) to choose such parameters that yield a thermal error (with its associated acceleration voltage) in the desired range. For typical projected images, using a resist that has a sensitivity of approximately 5 $\mu C/cm^2$ at 20 KeV, a dwell time in the range 0.1 to 10 $\mu s$, a magnification in the range 2 to 5, and a membrane thickness in the range 500 to 1500 Å are generally used. Exemplary obtainable reductions in overlay errors in accordance with equations (1) to (9) for such conditions is shown in FIGS. 3 and 4.

The exact value employed within the desired range is generally determined by other considerations. For example, if the proximity effect is a substantial factor for the particular image being projected, it is desirable to operate at higher voltages that still yield thermal error within the acceptable range (and thus at corresponding values of dwell time, magnification, and membrane thickness) since correction for such proximity effect is somewhat easier at higher voltages. Additionally, as previously discussed, better resolution is generally obtained from the electron optics at higher acceleration voltages. However, as voltage gets higher and, for silicon, exceeds about 180 KeV defects due to displacement of silicon atoms in the wafer matrix begin to affect device performance.

The effect of scan rate is based on a preferred scan procedure. To avoid unacceptable error, the electron beam is scanned over a relatively small area using a multi-cycle scan to expose this area. Typically, for masks such as described in co-pending U.S. patent application Ser. No. 07/814,953 (which is hereby incorporated by reference) the dwell time should be in the range 0.1 to 10 $\mu s$. Longer dwell times produce excessive error, while shorter dwell times produce substantial demands on the controlling electronics.

The number of cycles employed for a given area is determined by the dose required to expose the resist. For typical resist sensitivities in the range 0.05 $\mu Ccm^{-2}/kV$ to 1 $\mu Ccm^{-2}/kV$, beam currents in the range 50 $\mu A$ to 5 $\mu A$ and for typical dwell times in the range 0.1 $\mu s$ to 10 $\mu s$, 100 kHz to 10 MHz cycles are employed. (Currents less than 1 $\mu A$ are typically unacceptable since they lead to excessive exposure times while currents greater than 100 $\mu A$ are generally unacceptable since they lead to image blurring as a result of charged particle interactions. Generally, the current employed is determined by other factors such as desired throughput.) The size of an area scanned by the beam without relative movement of the mask and substrate is limited by the projection optics typically to areas in the range $1 \times 1$ to $10 \times 10$ mm at the wafer. Generally, for scan areas smaller than 1 mm on a side at the wafer, it is extremely difficult to prevent unacceptable thermal heating irrespective of scan rate. Although scan areas greater than $1 \times 1$ cm$^2$ are not precluded they are generally difficult to achieve with presently available electron optics.

Figure 1:
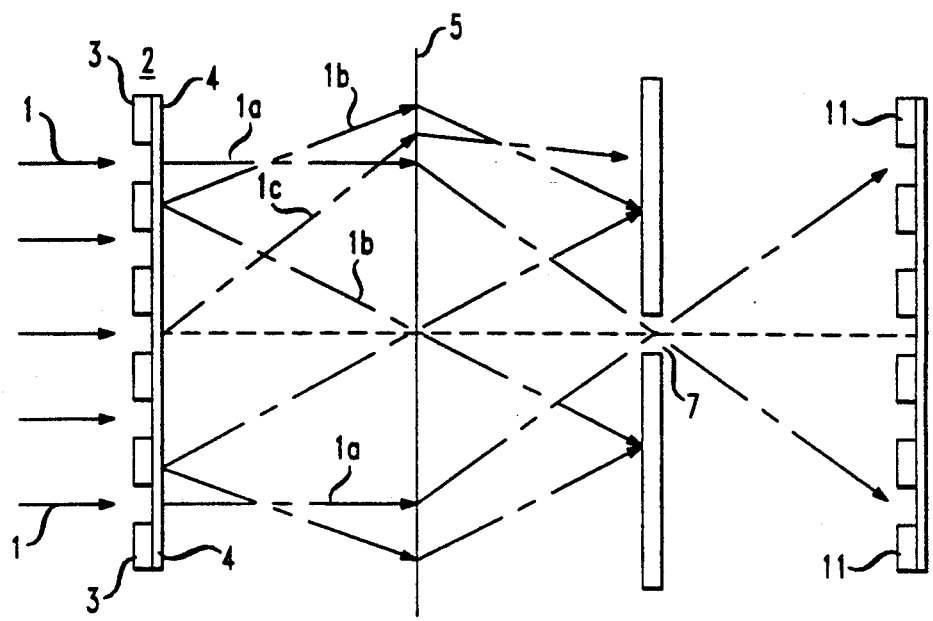
FIG. 1 is illustrative of a SCALPEL system.
Figure 2:
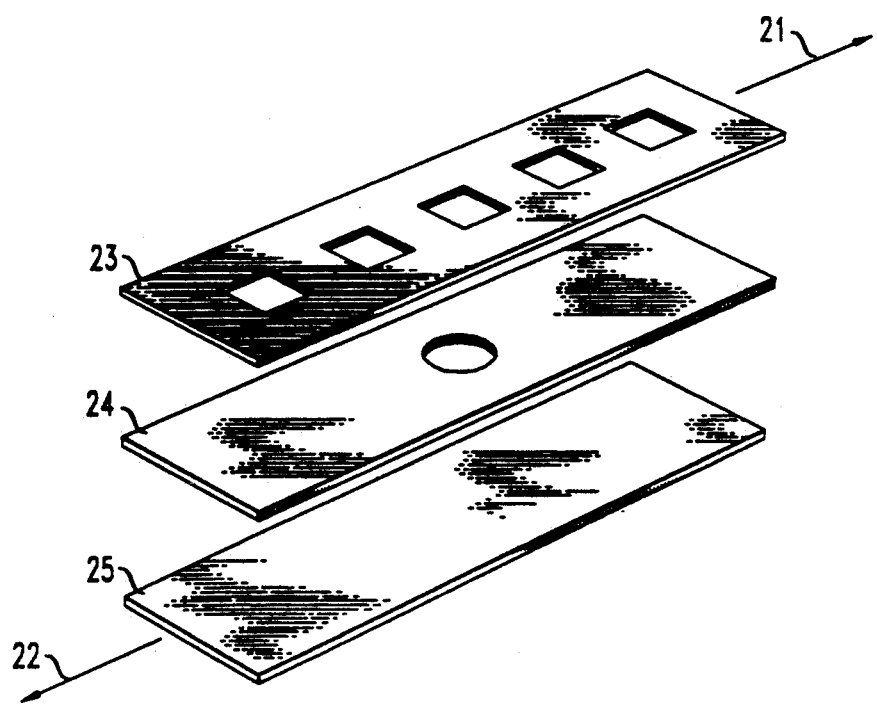
FIG. 2 is illustrative of a portion of an exposure technique employed in such system.

To image the entire pattern of the mask on the substrate, movement of the mask relative to the substrate is required. Clearly, since only 1% to 10% area of the mask is scanned in the cycle, (for typical mask sizes) the mask must be moved either continuously or stepwise to illuminate all desired regions. To ensure that a given portion of the mask is appropriately projected on the appropriate portion of the substrate, the direction of movement of the mask relative to the substrate depends on the optics but in systems such as shown in FIG. 2 it is in the opposite direction.

The dwell time, as discussed above, is interrelated to the demagnification factor. In operation, while the beam is cycling in a scan over a region of the mask, the mask is moving to present new regions to the scanning beam. For example, for 4:1 magnification, the mask should move at least 4 times as fast as the substrate to ensure appropriate positioning of the projected image. The relative rate generally would not be precisely 4 to 1 since the mask as presently contemplated—see U.S. patent application Ser. No. 07/814,953 which is hereby incorporated by reference—has struts (acting as supports and heat sinks) which are not imaged and must be traversed. By this combined method of appropriately cycling over a region while the mask and substrate are moving relative to each other, thermal error is substantially reduced in a SCALPEL exposure technique by choosing appropriate operating values for magnification, dwell time, and mask membrane thickness in accordance with equations 1 to 9.

The membrane thickness should additionally be such that nonuniformities of the membrane and the resulting non-uniform expansion with change in temperature should not unacceptably affect resolution. Generally, for acceleration voltages in the range 50 to 200 kV, membrane thicknesses in the range 500 Å to 2000 Å are employed. Since a repetitive cycle scan is generally used, it is possible to measure dosage in a given area for each cycle by measuring current at wafer or the back-scattering electron signal or aperture current. Subsequent cycles are adjusted to ensure the desired total dose is achieved.

We claim:

1. A method for fabrication of a device having a desired design rule, said method comprising at least one step lithographically delineating an image, and said step comprising illuminating, by scanning beam of particles having an acceleration, a plurality of imaging regions of a mask disposed on a membrane such that each of said regions is illuminated for a dwell time before scanning to the next of said regions, said mask comprising two areas differing in the degree of scatter imposed on said particles wherein said particles traversing the mask are projected with a demagnification of at least 1:1 onto a filter which allows said particles in said image to reach a substrate characterized in that said acceleration is induced by a potential in the range 50 to 200 KV and said dwell time, said membrane thickness, and said demagnification are chosen such that they yield a thermal contribution to the overlay error, $\Delta x_{tot}$, of less than 20% of said design rule as given by $$[\Delta x_{tot}]^2 = [\Delta x_{wafer}]^2 + [\Delta x_{mask}]^2$$

such that $$\Delta x_{wafer} = \delta_1 \cdot \delta_2 \cdot \frac{s}{M} \cdot \alpha \cdot \Delta T_{inst}$$

where M is said demagnification, $\alpha$ is the coefficient of expansion of said wafer, $\delta_1$ is 0.33, $\delta_2$ is 0.5, s is the subfield dimension of said mask and $$\Delta T_{inst} = \frac{P \cdot \Delta t}{C \cdot V}$$

with $\Delta t$ being said dwell time, C being the heat capacity of said substrate, P being the power incident on said substrate, V being given by $$V = \frac{d_h \cdot a}{M^2}$$

a being the area of said region, $d_h$ being the heated depth, and such that $$\Delta T_{im} = \left(\frac{P}{T}\right) \cdot \left(\frac{\Delta E}{E}\right) \cdot \left(\frac{\Delta t}{C_s V_s}\right) + \Delta T_{sm}$$

where $C_s$ and $V_s$ are the heat capacity and volume of said area of said mask causing the greatest scattering, ($\Delta E/E$) is the fractional energy lost by said particle in said mask, and T is the fraction of said particles incident on said substrate, and where $$\Delta T_{sm} = \left(\frac{P}{A}\right) \cdot a \left(\frac{1}{A' \cdot C_c}\right)$$

where A is the area scanned by said particles at said substrate and A' is the area of said mask in contact with a heat sink and $C_c$ is the thermal conductance from the pattern of said mask to said heat sink.

2. The process of claim 1 wherein said particle comprises an electron.

3. The process of claim 1 wherein said demagnification is 4:1.

4. The process of claim 3 wherein said dwell time is in the range 0.1 to 10 $\mu$s.

5. The process of claim 1 wherein said dwell time is in the range 0.1 to 10 $\mu$s.

6. The process of claim 1 wherein said membrane thickness is in the range 500 to 1500 Å.

7. The process of claim 1 wherein said regions are illuminated at a rate in the range 100 KHz to 10 MHz.

8. The process of claim 1 wherein said overlay error is less than 10% of said design rule.

9. The process of claim 1 wherein said overlay error is less than 5% of said design rule.

* * * * *